(12) United States Patent
Wilby

(10) Patent No.: US 7,020,577 B2
(45) Date of Patent: Mar. 28, 2006

(54) APPARATUS AND METHOD FOR INVESTIGATING SEMICONDUCTORS WAFER

(75) Inventor: Robert John Wilby, Bristol (GB)

(73) Assignee: Metryx Limited, Nailsea (GB)

(*) Notice: Subject to any disclaimer, the term of this patent is extended or adjusted under 35 U.S.C. 154(b) by 63 days.

(21) Appl. No.: 10/312,989

(22) PCT Filed: Jun. 29, 2001

(86) PCT No.: PCT/GB01/02926

§ 371 (c)(1),
(2), (4) Date: Jan. 3, 2003

(87) PCT Pub. No.: WO02/03449

PCT Pub. Date: Jan. 10, 2002

(65) Prior Publication Data

US 2003/0141572 A1    Jul. 31, 2003

(30) Foreign Application Priority Data

Jul. 5, 2000  (GB) ................................. 00165621

(51) Int. Cl.
*H01L 23/58* (2006.01)
*H01L 21/66* (2006.01)
*G01G 17/00* (2006.01)
*G01G 19/00* (2006.01)

(52) U.S. Cl. ............................ 702/173; 177/50; 438/5; 438/14; 216/59; 216/84; 257/632

(58) Field of Classification Search ................ 702/173; 177/50; 438/5, 14; 216/84, 59
See application file for complete search history.

(56) References Cited

U.S. PATENT DOCUMENTS

| | | | | |
|---|---|---|---|---|
| 3,949,295 A | * | 4/1976 | Moorshead | 324/760 |
| 4,666,005 A | * | 5/1987 | Komoto et al. | 177/180 |
| 4,713,724 A | * | 12/1987 | Voelkel | 361/231 |
| 4,783,597 A | * | 11/1988 | Misawa et al. | 250/492.2 |
| 5,625,170 A | * | 4/1997 | Poris | 177/50 |
| 5,750,938 A | * | 5/1998 | De Caris et al. | 177/50 |
| 2003/0141572 A1 | * | 7/2003 | Wilby | |

FOREIGN PATENT DOCUMENTS

DE          3 106 534          10/1982

(Continued)

OTHER PUBLICATIONS

"Field and Wave Electromagnetics" Cheng, David K.; Syracuse University; Addison-Wesley Publishing Co.; Reading, MA; pp. 95-105;Mar. 1995.*

(Continued)

*Primary Examiner*—Randy W. Gibson
(74) *Attorney, Agent, or Firm*—Stites & Harbison PLLC; Ross F. Hunt, Jr.

(57) ABSTRACT

In order to determine the dielectric constant of a layer deposited on a semiconducotr wafer (2), the density of the layer is obtained. To obtain that density, the wafer (2) without the layer is weighed in a weighing chamber (4) in which a weighing pan (7) supports the wafer on a weighing balance. The weight of the wafer is determined taking into account the buoyancy exerted by the air on the wafer (2). Then the layer is deposited on the wafer (2) and the weighing operation repeated. Alternatively a reference wafer may be used. If the material of the layer is known, the weight of the layer can be used to derive its density using a thickness measurement. Alternatively, if the density is known, the thickness can be obtained.

6 Claims, 3 Drawing Sheets

FOREIGN PATENT DOCUMENTS

| | | |
|---|---|---|
| EP | 0 932 194 A1 | 7/1999 |
| EP | 1 296 367 A1 | 3/2003 |
| JP | 30199908 A | 8/1991 |

OTHER PUBLICATIONS

A. Courtot-Descharles, F. Pires, P. Paillet, J.L. Leray; "Density functional theory applied to the calculation of dielectric constant of low-k materials;" Microelectronics Reliability, vol. 39, pp. 279-284, 1999.

English language abstract of "Structural Characterization of Thin Films by Grazing Incidence X-ray Reflectivity" by Koima et al. Journal of the National Institute of Materials & Chemical Research v 7 n 6 , 1999.*

English language abstract of "Composition and Thickness Determination of Thin Oxide Films: Comparison of Different Programs and Methods" by Sammelselg et al, Journal of Analytical Atomic Spectrometry v 14 n 3 1999.*

* cited by examiner

FIG 5
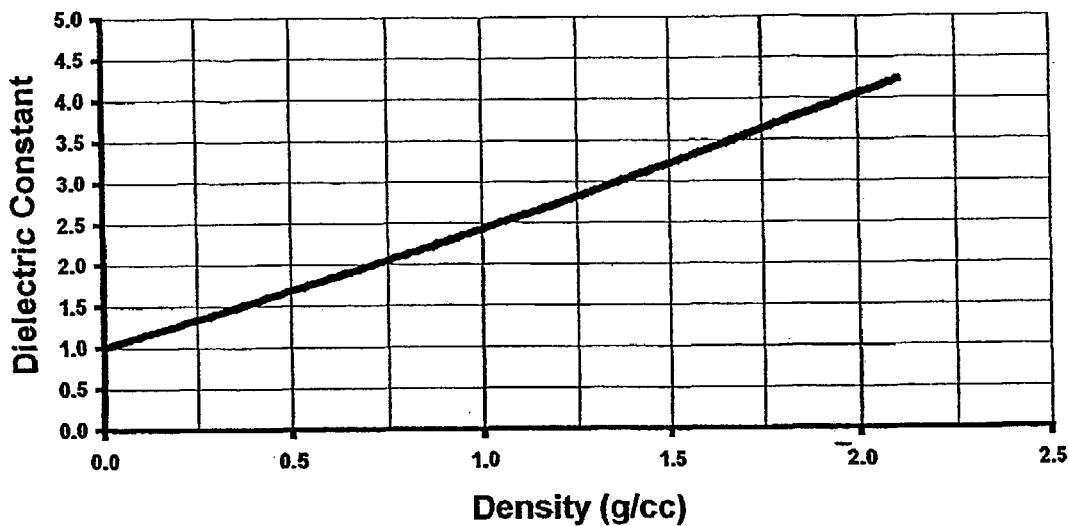
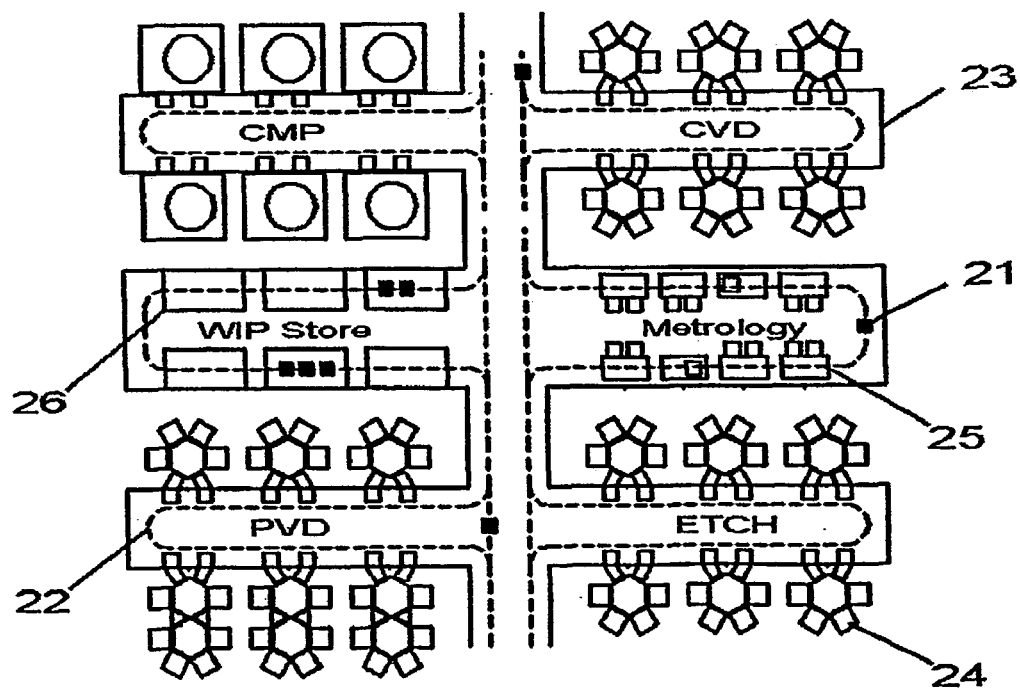
FIG 6

APPARATUS AND METHOD FOR INVESTIGATING SEMICONDUCTORS WAFER

BACKGROUND OF THE INVENTION

1. Field of the Invention

The present invention relates to the investigation of semiconductor wafers. It relates particularly, but not exclusively, to the determination of the mass, weight and/or dielectric constant of a layer deposited on such a wafer.

It also relates to the investigation of thickness of layers deposited on such a wafer.

2. Summary of the Prior Art

It is already known to investigate the thickness of a layer on a semiconductor waver, but existing thickness methods are specific to the type of material applied to the wafer. For example, when the layer is an insulator deposited the layer, its thickness investigated by ellipsometry or spectral reflectivity, whereas if the layer deposited is a metal, its thickness is investigated by measuring its surface resistivity. When a layer is subsequently etched, its subsequent thickness may be measured by interferometry or by using a service profiler.

SUMMARY OF THE INVENTION

The present invention has its origin in the realisation that the determination of the mass or weight of a layer deposited on a semiconductor wafer may enable various properties of the wafer subsequently to be determined. In particular:

(1) If the mass of the layer can be determined, then the thickness of the layer can be determined if the density of the material is known;

(2) If both the mass and the thickness of the layer can be determined, then its density can be determined;

(3) If the density of a layer can be determined, then it has been realised that there is a relationship between the density and the dielectric constant of the layer, and hence it is possible to determine the dielectric constant from the density.

(4) In Statistical Process Control of semiconductor wafers, measurements of the thickness of the layer have been used as a guide to the consistency of the processes being used. However, as mentioned above, known ways of measuring thickness are dependent on the material. It has been realised that mass or weight of the layer itself gives a guide to the consistency of the process.

The present invention has several aspects, concerned with applying these realisations.

In the first aspect, the mass or weight of the layer and the thickness of the layer are measured, to obtain a value representing the density of the layer. From that density measurement, the dielectric constant is determined.

The thickness of the layer may be obtained by one or more of the known methods referred to above. To determine the weight or mass, several methods may be used. For example, the weight of the semiconductor wafer both before and after the layer is formed thereon may be compared with a calibration weight having the same density as the semiconductor wafer. Alternatively, the weight of the wafer with the layer to be measured may be compared with a reference semiconductor wafer. As another alternative, the layer may be weighed under vacuum using an appropriate balance.

However, such weighing methods are prone to inaccuracies. It has been realised that if the wafer is weighed in air, and a correction is made for the buoyancy exerted on the wafer by the air an accurate measurement of the mass of the layer deposited on the layer may be determined. Although the use of such a buoyancy correction may be used in the first aspect of the invention, the use of a buoyancy correction to determine the mass or weight of a layer on a semiconductor wafer represents a second independent aspect of the invention.

In this second aspect, the present invention relates to a weighing apparatus and a method of weighing thin layers on the surface of semiconductor wafers which compensates for such variations in ambient conditions, and in particular to an apparatus or method which incorporates the buoyancy exerted upon the semiconductor wafer being weighed into the calculation of the mass of a thin layer deposited on that wafer.

The second aspect may then be used in a method of determining the thickness of a thin layer on a semiconductor wafer by determining the mass of the layer and calculating the thickness using a known density value, or a method for determining the density of a material deposited on a wafer using a layer of known thickness. Furthermore, the density so determined can be used to calculate the dielectric constant of the material of the layer.

Accordingly, the second aspect of the present invention may provide an apparatus for weighing a thin-layer deposited on the surface of a semi-conductor wafer, the apparatus comprising:

a weighing chamber containing a weighing instrument to weigh a semiconductor wafer, the weighing instrument having means to receive a wafer;

a temperature sensor, a pressure sensor and a humidity sensor, for monitoring conditions in the weighing chamber; and a processor to receive measurements from the temperature, pressure and humidity sensors, the processor being arranged to calculate the air-density within the chamber from these measurements.

It is preferred that the weighing instrument has an internal calibration weight which is used to set the zero and linearity of the readings for the subsequent measurements. The calibration weight is preferably made of stainless steel having a density of 8.000 g/cc.

The buoyancy exerted on the wafer may be calculated from the calculated air density, the weight of the wafer, the density of the wafer and the density of a calibration wafer used to calibrate the balance. A suitable formula for calculating the buoyancy exerted on the wafer is described below.

It is preferred that the processor is arranged to calculate the buoyancy exerted on the wafer, in which case the processor may receive a weight measurement from the balance and density measurements which may be input by a user.

The mass of the wafer can then be calculated by adding the buoyancy value to the weight measurement. It is preferred that the processor is also configured to calculate the mass of the wafer from the weight and buoyancy values.

The weighing chamber may comprise:

a housing having a opening for entry of a wafer;

a weighing instrument in the housing to measure the weight of the wafer, the weighing instrument having a balance in connected to a weighing pan for receiving a wafer; and temperature, pressure and humidity monitors, to determine the temperature, pressure and humidity within the housing.

The weighing chamber may be made and sold separately from the rest of the apparatus and so represents a separate (third) independent aspect of the invention.

The housing preferably comprises a plurality of side walls, e.g. four, and upper and lower walls. It is preferred that one of the walls is removable, and can be removed for cleaning, most preferred is that the upper wall is a removable lid. The opening may be provided between the upper wall and one of the side walls.

It is preferred that the opening in the housing through which the arm may be moved is the only opening in the housing, the opening is preferably relatively small, e.g., the minimum size which allows movement of the arm through it, so as minimise the effects of the outside conditions on the interior of the chamber. An optional door may be positioned over the opening to shield the opening, for example if the environment is particularly prone to draughts.

Where necessary, an optional DC accelerometer may be used to identify external vibration or floor movements that might upset the weighing balance.

It is preferred that the chamber has a divider to divide the chamber into upper and lower chambers, the upper chamber housing the weighing pan and the lower chamber housing the balance, the divider being provided with an aperture through which the connection between the weighing pan and the balance may pass. In this situation it is preferred that the sensors are located in the upper chamber. Preferably, the chamber walls, including the divider, are made of electrically and/or thermally conductive material.

The distance between the upper wall of the upper chamber and the divider is preferably small enough to avoid air convection, but great enough to minimise the force exerted on the wafer due to the wafer surface. It is preferred that the weighing pan is equidistant from the upper wall of the upper chamber and the divider. The gap between the wafer and either the upper wall of the upper chamber or the divider is preferably in the range of 5–15 mm.

The chamber may include a heater, and the interior of the weighing chamber is preferably maintained at a substantially constant temperature, e.g., within +/−0.1° C. If heated, the enclosure is preferably maintained within 5° C. of the ambient temperature.

Preferably, the weighing instrument has readability of 0.01 mg over a range of 0–80 g. For larger than 200 mm wafers the range would have to be extended based on the nominal weight of the wafers. The instrument preferably has a repeatability of better than 0.03 mg and a temperature sensitivity drift of less than 1 part in $10^6$/° C.

The pressure sensor preferably has an accuracy of better than 0.04% over the range 800–1200 mbar absolute. Temperature sensitivity is preferably less than 0.02%/° C. Response time is preferably less than 200 ms.

The temperature sensor preferably has an accuracy of better than 0.2° C. and a response time of less than 10 seconds. The humidity sensor preferably has an accuracy of better than 2% and a response time of less than 1 minute.

The weighing chamber may also be associated with a robotic arm controlled by a computer, the arm having means releasably to carry a wafer, and being moveable from outside the chamber to inside the chamber, through the opening in the housing, to place the wafer on the weighing pan.

The apparatus may further include a thermal transfer plate to receive a wafer before it is placed on the weighing pan. Preferably the thermal transfer plate is located within the weighing chamber. The thermal transfer plate is preferably made of an electrically and/or thermally conducting material, so that any static electricity on the wafer is dispersed before measurement, a preferred material being aluminium.

The arm may be capable of carrying a wafer from outside the chamber to the thermal transfer plate, placing the wafer on the thermal transfer plate and then moving the wafer to the weighing pan.

The apparatus may further include an anti-static ioniser, comprising a balanced quantity of positive and negative ions used to disperse static electricity within the equipment and on the surface of the wafer.

In a further (fourth) aspect the invention provides a method for determining the thickness of a thin-layer deposited on a semiconductor wafer, or for determining the density of a thin-layer deposited on a semiconductor wafer, which method involves determining the mass of the thin-layer, incorporating the effect of the buoyancy exerted upon the wafer during the weighing process. The method may comprise the (non-sequential) steps of:

placing a wafer on a weighing instrument in a chamber;
measuring the weight of the wafer;
determining the air density in the chamber;
determining the buoyancy exerted on the wafer from the air density; and
determining the mass of the wafer taking into account the buoyancy exerted upon it;
repeating the above steps with the wafer with a thin-layer deposited thereupon;
subtracting the mass of the wafer without the thin-layer deposited thereupon, from the mass of the wafer with the thin layer deposited thereupon to calculate the mass of the layer;
determining the thickness of the layer from the calculated mass of the layer and a known density value of the material of the layer, or determining the density of the material from the calculated mass and a known thickness value.

Where the mass of the deposited layer is of interest per se, for example in quality control analysis, the above method may be used to calculate an accurate mass of the layer and the density or thickness of the layer need not be determined. Thus the mass can be determined as an alternative to the thickness.

The method may also be used to determine the thickness of a layer which has been removed from a wafer, or to determine the amount of material removed from a layer, such as when vias (holes) or trenches are made in a layer. In this situation, the wafer is weighed and the mass determined as described above, once the layer has been removed, then the mass of the wafer measured as set out above and the thickness of the layer which has been removed is determined by subtraction.

The method may also be used to determine the weight loss or re-absorption of water or other solvents over time, in the situation where the films are not stable.

For insulating materials, the density value may be used in the second aspect of the invention to calculate the dielectric constant of the layer. Accordingly, determining the dielectric constant of a substance from the mass of a thin-layer of that substance deposited on a semiconductor wafer represents a further aspect of the invention.

The method according to the invention is applicable to a diverse range of materials and is suitable for statistical process control. It provides a fast and non-destructive method of achieving accurate results.

The air density in the chamber may be determined by measuring the temperature, pressure and humidity in the chamber and calculating the air density from these parameters. The formula used may be:

$$\rho_{air} = \frac{0.3485 \times P - 0.00132 \times (0.0398 \times T^2 - 0.1036 \times T + 9.5366) \times H}{(273.14 + T) \times 1000}$$

Where $\rho_{air}$ is the density of the air in g/cm$^3$, P is the pressure in mBar, T is the temperature in ° C. and H is the relative humidity in %.

Alternatively the air density may be calculated by using two calibration weights of known mass and of different known density. To reduce errors, it is preferable if the two densities are as far apart as practicable. This method yields two simultaneous equations involving the measured weight and the air density from which the air density can be calculated. In this situation, the temperature pressure and humidity sensors may be omitted from the apparatus, or as is preferred, this method may be used in addition to the equation given above, as an extra level of calibration.

The buoyancy exerted on the wafer may be calculated from the air density, the known density of the wafer, for example, the density of single crystal silicon is 2.329 g/cm$^3$, the density of a calibration weight used to calibrate the balance and the weight of the wafer. The following formula is preferably used:

$$B = W_w \times \frac{\left(\frac{\rho_{air}}{\rho_w} - \frac{\rho_{air}}{\rho_c}\right)}{1 - \frac{\rho_{air}}{\rho_w}}$$

Where B is the Buoyancy effect in grams, $W_w$ is weight of the wafer in grams, $\rho_w$ is the density of the wafer in g/cm$^3$ and $\rho_c$ is the density of the calibration weight used to calibrate the weighing balance in g/cm$^3$.

The mass of the wafer with or without the layer may be determined using the formula:

$$M_w = W_w + B$$

The dielectric constant (relative permittivity) of the material may be determined from the density using the following formula:

$$\varepsilon = \frac{2 \cdot \alpha \cdot \rho - \varepsilon_0}{\alpha \cdot \rho - \varepsilon_0}$$

Where $\varepsilon$ is the dielectric constant, $\varepsilon_0$ is the permittivity of free space, $\rho$ is the density of the film and $\alpha$ is a constant for the particular type of material in question.

Alternative methods for determining the thickness or density of a layer include weighing the semiconductor wafers under vacuum. This technique might be preferable where the measurements need to be incorporated into vacuum processing equipment. Or the weighing balance may be calibrated using a calibration weight having the same density as a semiconductor wafer. Because the air buoyancy is proportional to volume, the calibration process corrects for it automatically, without the need for independent calculation of the air density. This method suffers from the fact that the air density cannot be independently verified.

The invention may also provide a program for a computer, the program comprising code to perform the steps of the method described above. The program may be stored on a recording medium, for example a computer disc.

Another (fifth) aspect of the invention concerns Statistical Process Control in the manufacture of semiconductors wafers. This makes use of the fact that the properties of deposited or etched layers on a semiconductor wafer should be consistent, and therefore the statistical variation in those properties provides a measure of the accuracy, or otherwise, of the processes being carried out. Conventionally, thickness measurements have been used to provide statistical analysis, but such thickness measurements are dependent on the type of material of the layer, as mentioned above. It has been realised that measurement of the mass of the layer may itself be used to provide statistical analysis, and therefore this represents another aspect of the invention.

Preferably, the mass is measured taking buoyancy into account, as has previously been mentioned with reference to the second to fourth aspects, but this fifth aspect of the invention is not limited to this.

BRIEF DESCRIPTION OF THE DRAWINGS

An embodiment of the invention will now be described with reference to the accompanying drawings in which:

FIG. 5 shows a typical relationship between the density and the dielectric constant for carbon doped silicate glass films; and FIG. 6 is a diagram of a wafer processing factory in which the present invention may be used.

DETAILED DESCRIPTION

Figure 1:
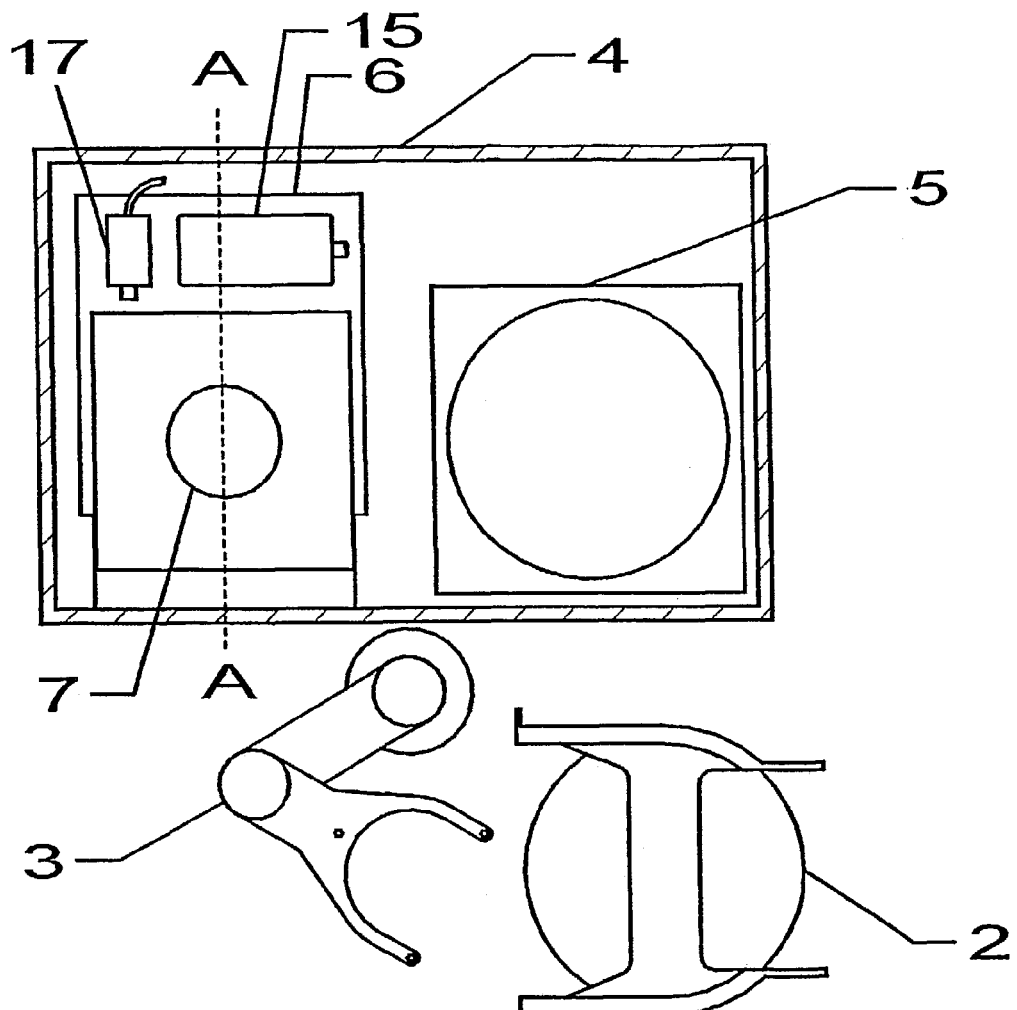
FIG. 1 shows a plan view of the equipment with the lid removed to show the interior.

Referring first to FIG. 1, a number of semiconductor wafers 2 are held within a carrier 1 outside the chamber 4. The robotic arm 3 takes each wafer in turn and moves it inside the chamber 4 through aperture 10 in the walls of chamber, which can be seen in FIG. 2. The arm 3 places one of the wafers 2 on the thermal transfer plate 5 within the weighing chamber 4. The wafer 2 is left for a period of time, e.g., between 10 and 60 seconds while it comes into equilibrium with the temperature of the equipment. The robotic arm then takes the wafer from the thermal transfer plate 5 and places it onto the weighing pan 7 of the weight instrument, e.g. a Sartorius BP2IID, though any suitable accurate balance could be used.

The weight readings are continually monitored until the reading has settled, usually within 15 to 45 seconds. The robotic arm 3 then removes the wafer and places it back into the carrier 1.

The equipment is mounted on a firm, level surface free from vibration and not prone to movement (for example bowing of the floor as people or equipment move past). The enclosure and balance can be made level by using adjusting feet located at each corner of the base of the enclosure.

The wafer carrier 1 is made of static dissipative material and the thermal transfer plate is made of an electrically conducting material, so that any static electricity on the wafer is dispersed before measurement.

The interior of the weighing chamber 4 is maintained at a substantially constant temperature, e.g., within +/−0.1 ° C. Where the ambient conditions vary by more than this then the enclosure may be electrically heated with resistance heaters and maintained at a temperature slightly above ambient. If heated, the enclosure should be maintained within 5° C. of the ambient temperature, to avoid the risk of convection currents.

Figure 2:
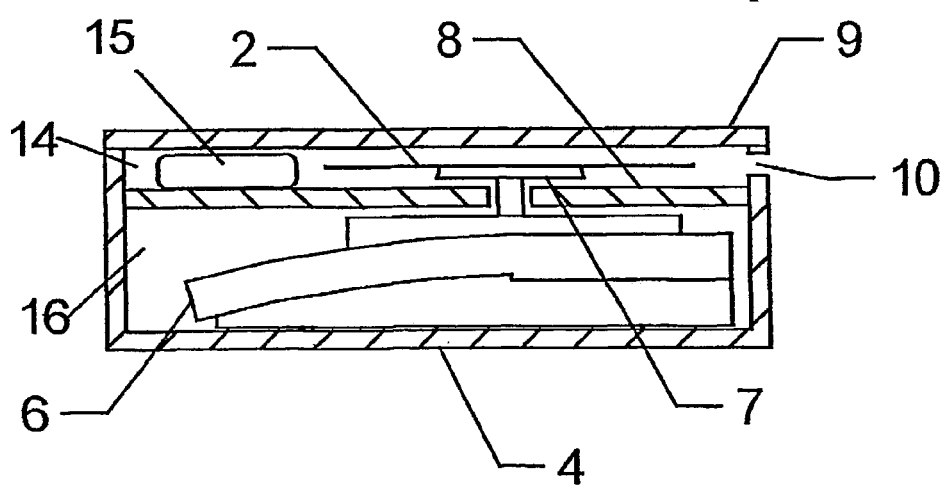
FIG. 2 shows a section through line A—A of the equipment shown in FIG. 1.

Turning now to FIG. 2, the weighing chamber 4 is divided into two separate compartments by the divider 8. A lid 9 is shown in position on top of the chamber in this Figure. The lower compartment 16 houses the weighing balance while the upper compartment 14 houses the weighing pan 7, and the wafer 2 when this is on the pan.

All walls of the chamber, the divider and the lid are made of materials having good electrical and thermal conductivity and are in good thermal and electrical contact with each other. The chamber should be electrically conducting to prevent any electrical static charge from building up in the vicinity of the weighing instrument.

The semiconductor wafers 2 are weighed in a horizontal orientation. The surfaces of the chamber above and below the wafer surface during weighing, i.e. lid 9 and divider 8 are close enough to prevent air convection currents but far enough apart that any residual electrical charge on the wafer is not attracted to the chamber surfaces. An opening 10 allows access for the robotic arm and wafer.

The pressure sensor 17, which may be e.g. a Druck PMP4010AB, is mounted so that the sensing port is within the upper balance enclosure.

The combined temperature & humidity sensor 15, e.g. a Pico RHO2, is also mounted within the upper balance enclosure.

Any suitable sensors with the appropriate accuracy could be used.

Figure 3:
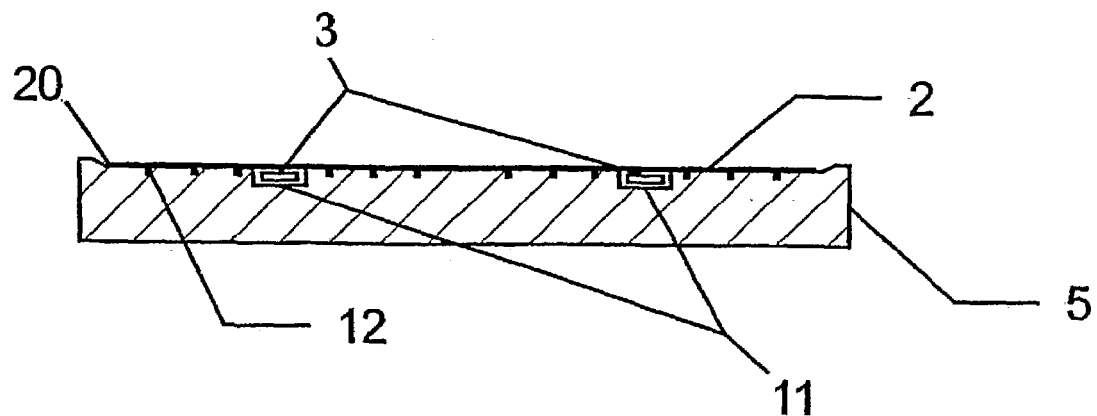
FIG. 3 shows a section through the thermal transfer plate.

FIG. 3 shows the arrangement of the thermal transfer plate. Each wafer 2 is placed in turn onto the upper surface 20 of the plate 5 by the robotic arm 3. Recesses 11 in the plate allow the robot arm 3 to lower so that the wafer 2 is in contact with the surface 20 of the plate 5. A number of grooves 12 in the plate allow trapped air to escape as the wafer is lowered and prevent it from floating out of position.

The thermal transfer plate 5 is made from aluminium, although any material with good conductivity could be used. The thermal transfer plate equalises the temperature of the wafer to the temperature of the chamber to within +/−0.1° C. This minimises the possibility of any convection currents within the balance enclosure and avoids any thermal variation of the balance that might upset its calibration.

Figure 4:
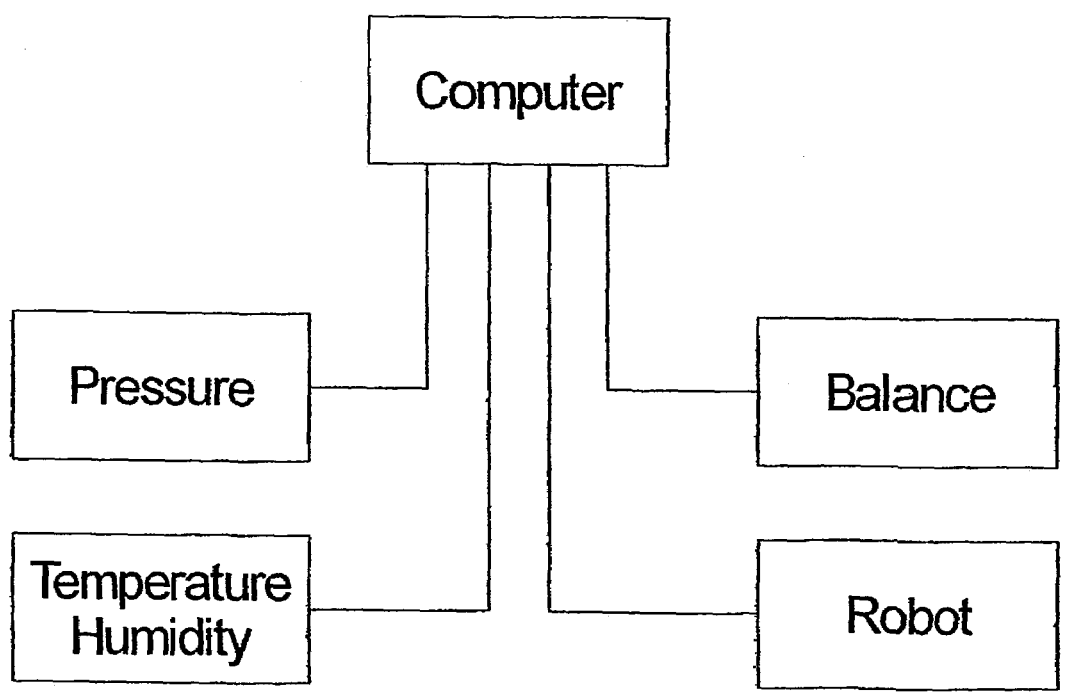
FIG. 4 shows a block diagram of the electronics control.

FIG. 4 shows the control architecture. The balance and robot arm communicate to a central PC via separate RS232 data links. The combined Temperature & Humidity sensor, communicates via an additional RS232 link. The analogue output of the pressure sensor is converted by a 12bit A/D converter before being transmitted over an IEEE1284 data link.

To achieve an accurate weighing result, variations in air density due to ambient conditions are corrected for. The air density is determined and then used to calculate the buoyancy effect on the semiconductor wafer. The air density is calculated by the following formula $$\rho_{air} = \frac{0.3485 \times P - 0.00132 \times (0.0398 \times T^2 - 0.1036 \times T + 9.5366) \times H}{(273.14 + T) \times 1000}$$

Where $\rho_{air}$ is the density of the air in g/cm$^3$, P is the pressure in mBar, T is the temperature in ° C. and H is the relative humidity in %.

The air density is then used to calculate the buoyancy exerted on the semiconductor wafer using the following formula:

$$B = W_w \times \frac{\left(\frac{\rho_{air}}{\rho_w} - \frac{\rho_{air}}{\rho_c}\right)}{1 - \frac{\rho_{air}}{\rho_w}}$$

Where B is the Buoyancy effect in grams, $W_w$ is weight of the wafer in grams, $\rho_w$ is the density of the wafer in g/cm$^3$ and $\rho_c$ is the density of the calibration weight used to calibrate the weighing balance in g/cm$^3$.

The density of the wafer $\rho_w$ is well defined due to the purity and crystalline nature of the substrate. The density of single crystal silicon is 2.329 g/cm$^3$. There is a small error due to the thickness of the thin film on the surface.

A thin film of thickness 0.5 µm and density 1 g/cm3 on a wafer of thickness 725 µm produces a systematic error of 0.16% in the density. Knowing the approximate target density would allow a correction to be made, reducing the error still further.

Finally, the mass of the wafer $M_w$ is calculated from the weight $W_w$ and the buoyancy B using the formula $$M_w = W_w + B$$

Preferably, enhancement would be to use a reference semiconductor wafer as the calibration weight.

In order to calculate the density of a thin film either deposited or removed from the semiconductor wafer surface two separate weighing measurements are made. The wafer is pre-measured, then the wafer is subjected to the process or processes required to deposit or remove the thin film and then it is re-measured afterwards. The difference between the two mass readings provides the mass of the thin film.

The thickness for insulating dielectrics may be measured using existing equipment readily available within semiconductor fabrication facilities using techniques such as ellipsometry or spectral reflectivity. Typical equipment used for this are the Thermawave Optiprobe or the Rudolph FEVII.

Knowledge of the thickness and the mass of the thin film allows the density to be determined.

Alternatively, if the density of the thin film is well characterised then this technique can be used to determine the thickness of the film without the need for other equipment. In particular, this technique is applicable over wide variety of different materials including metals and insulators simultaneously and so is ideal for incorporation into statistical process control environments where often each wafer is measured after each manufacturing process. The weighing equipment can be incorporated into the material handling equipment within semiconductor fabrication facilities. For example, in wafer sort & merge stations, WIP & storage stations or within cluster tool handling platforms to provide in-situ process control.

This technique may also be used to determine the amount of material removed during etching or CMP processes or for timed etch applications in damascene trench applications.

For a particular type of material the density of the thin film is linked to the dielectric constant (relative permittivity) of the material by the equation (see also the correlation in FIG. 5)

$$\varepsilon = \frac{2 \cdot \alpha \cdot \rho - \varepsilon_0}{\alpha \cdot \rho - \varepsilon_0}$$

Where $\varepsilon$ is the dielectric constant, $\varepsilon_0$ is the permittivity of free space, $\rho$ is the density of the film and $\alpha$ is a constant for the type of material.

Using this equation, the density measurement may be used to calculate the dielectric constant of the thin film.

As was previously mentioned, the present invention may be used in Statistical Process Control, in which the weight measurement is used as a statistical guide to the accuracy of the processes carried out.

FIG. 6 depicts a simplified view of part of a typical semiconductor fabrication facility. Processing equipment 24 are arranged in aisles 23 and grouped according to function. Measuring equipment 25 are housed in a central location. In an automated facility, cassettes 21 of semiconductor wafers are transported using an overhead track system 22. Alternatively, Automated Guided Vehicles (AGV) may be used.

When not being processed, cassettes of wafers are kept inside Stockers 26 within a WIP store. A typical processing step involves a central factory computer determining which process is required next for a particular cassette. The cassette is queued within the Stocker until the processing tool is available. The cassette leaves the Stocker, is transported to the processing tool by the overhead track, is processed and then returned to the Stocker.

Typically, in Statistical process Control environments, the thickness of the layer just deposited or removed from the wafers within the cassette will then need to be measured.

In existing facilities, the central computer must determine the appropriate type of measuring equipment and the wafer is again queued waiting for its availability. When available, the cassette leaves the Stocker, is transported to the measuring equipment and then returned to the Stocker to wait for the next processing step.

An alternative method of operation incorporating the current invention is to combine the accurate weighing apparatus of FIG. 1 with the Stocker 26 within the WIP store. As described previously, the weighing apparatus can be used to determine the amount of material deposited or removed from the wafer after each processing step, by comparison of successive weighing operations. Because the weighing method is applicable to a wide range of different materials this eliminates the need to visit a specific piece of measuring equipment appropriate to the last processing step. It would not be practical to incorporate all of the existing, different types of measuring equipment within the Stocker 26.

Incorporating the measurement as part of the Stocker 26 reduces the number and variety of measuring equipment required in the facility.

It also reduces the number of material movement operations required, potentially by 50%. This reduces the capacity of the overhead track required and improves the cycle time of the facility significantly.

The invention claimed is:

1. A method of Statistical Process Control for monitoring the statistical variation in properties of layers deposited on a semiconductor wafer according to a plurality of manufacturing processes, and for providing a statistical analysis of the accuracy of the processes being carried out, wherein measurement of the mass of said deposited layers is used to provide said statistical analysis.

2. A method of Statistical Process Control according to claim 1 wherein multiple properties of a layer deposited on a semiconductor wafer are determined from a single mass measurement.

3. A method of Statistical Process Control according to claim 1 wherein the mass of said deposited layer is measured taking into account the effects of buoyancy exerted upon the wafer by the air.

4. A method of Statistical Process Control according to claim 1 wherein the density of a layer is determined from the measured mass thereof, and the dielectric constant of the layer is determined by applying a predefined relationship between the density and the dielectric constant of the layer to derive from the density the dielectric constant of the layer.

5. A method of Statistical Process Control according to claim 4 wherein the dielectric constant of the material is determined from the density thereof using the following formula:

$$\varepsilon = \frac{2 \cdot \alpha \cdot \rho - \varepsilon_0}{\alpha \cdot \rho - \varepsilon_0}$$

where $\varepsilon$ is the dielectric constant, $\varepsilon_0$ is the permittivity of free space, $\rho$ is the density of the layer and $\alpha$ is a constant for the layer.

6. A method of Statistical Process Control according to claim 2 wherein the multiple properties of said layer include one or more of: the density of a layer deposited on a wafer; and the dielectric constant of a layer.

* * * * *